United States Patent
Selvamanickam

(10) Patent No.: US 10,734,138 B2
(45) Date of Patent: Aug. 4, 2020

(54) MULTI-FILAMENT SUPERCONDUCTING COMPOSITES

(71) Applicant: University of Houston System, Houston, TX (US)

(72) Inventor: Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 479 days.

(21) Appl. No.: 15/722,771

(22) Filed: Oct. 2, 2017

(65) Prior Publication Data
US 2018/0033524 A1 Feb. 1, 2018

Related U.S. Application Data

(62) Division of application No. 13/935,033, filed on Jul. 3, 2013, now Pat. No. 9,786,415.

(60) Provisional application No. 61/668,140, filed on Jul. 5, 2012.

(51) Int. Cl.
| H01B 12/06 | (2006.01) |
| H01L 39/14 | (2006.01) |
| H01L 39/24 | (2006.01) |
| H01B 13/00 | (2006.01) |

(52) U.S. Cl.
CPC ......... *H01B 12/06* (2013.01); *H01B 13/0036* (2013.01); *H01L 39/143* (2013.01); *H01L 39/2464* (2013.01); *H01L 39/2467* (2013.01)

(58) Field of Classification Search
CPC ... H01B 16/06; H01B 13/0036; H01L 39/143; H01L 39/2464; H01L 39/2467
See application file for complete search history.

(56) References Cited

U.S. PATENT DOCUMENTS

| 6,828,507 | B1 * | 12/2004 | Fritzemeier | C30B 23/02 174/125.1 |
| 7,496,390 | B2 * | 2/2009 | Thieme | H01L 39/143 505/231 |
| 7,627,356 | B2 * | 12/2009 | Zhang | H01L 39/143 148/421 |
| 7,674,751 | B2 * | 3/2010 | Malozemoff | H01L 39/143 505/430 |
| 2003/0032560 | A1 * | 2/2003 | Otto | H01L 39/143 505/100 |
| 2007/0145100 | A1 | 6/2007 | Suzuki et al. | |
| 2009/0298697 | A1 | 12/2009 | Zhang et al. | |
| 2011/0319271 | A1 * | 12/2011 | Selvamanickam | H01L 39/143 505/231 |

FOREIGN PATENT DOCUMENTS

JP          2004-531851 A    10/2004

OTHER PUBLICATIONS

PCT/US2013/049313 International Search Report and Written Opinion dated Apr. 24, 2014 (15 p.).

* cited by examiner

*Primary Examiner* — Colleen P Dunn
(74) *Attorney, Agent, or Firm* — Blank Rome LLP

(57) ABSTRACT

A configuration and a method of constructing a high-temperature superconductor tape including a plurality superconducting filaments sandwiched between a substrate and an overlayer comprising compliant material extending to the substrate through gaps between each superconducting filament thereby isolating each superconducting filament.

22 Claims, 4 Drawing Sheets

MULTI-FILAMENT SUPERCONDUCTING COMPOSITES

CROSS-REFERENCE TO RELATED APPLICATIONS

This application is a Divisional of U.S. patent application Ser. No. 13/935,033, filed Jul. 3, 2013, issuing on Oct. 10, 2017 as U.S. Pat. No. 9,786,415, which claims benefit of U.S. Provisional Patent Application No. 61/668,140, filed on Jul. 5, 2012, both of which are hereby incorporated herein by reference in their entirety.

STATEMENT REGARDING FEDERALLY SPONSORED RESEARCH OR DEVELOPMENT

Not applicable.

BACKGROUND

Field of the Disclosure

This disclosure relates to superconductors, specifically to improving the mechanical and electrical properties of superconducting tapes.

Background of the Disclosure

Several materials and systems are being researched in order to solve the looming problems with energy generation, transmission, conversion, storage, and use. Superconductors may be a unique system solution across a broad spectrum of energy problems. More specifically, superconductors enable high efficiencies in generators, power transmission cables, motors, transformers and energy storage. Further, superconductors transcend applications beyond energy to medicine, particle physics, communications, and transportation. Superconducting having epitaxial, single-crystal-like thin films on polycrystalline substrates are currently being developed.

There are about nine components in a typical second-generation (2G) high-temperature superconducting (HTS) tape. The architecture consists of several oxide films on a metallic substrate and capped with silver and copper overlayers. The composite structure is prone to issues such as debonding between individual layers and delamination within the superconductor layer. Transverse tensile strength measurements on some conventional 2G HTS tapes, wherein a tensile stress is applied normal to the tape's surface, have shown evidence of weakness, although transverse tensile measurement experiments are themselves prone to non-uniform stress states which may render the validity of the obtained data questionable. A uniform pull or stress may be imparted on the tape by means of Lorentz force acting mutually or mutually applied perpendicular to a transport current flowing through a superconducting tape in conjunction with an externally applied magnetic field. The fracture surfaces of the 2G HTS tape provide insight into the interfaces and films architecture or structures that are prone to debonding and delamination. More specifically, the interface between the $LaMnO_3$ (LMO) top buffer layer and the $REBa_2Cu_3O_x$ (REBCO) superconducting film is prone to debonding, and the REBCO itself is prone to delamination within the overall architecture of the HTS tape.

Additionally evidence of weak transverse strength in tapes in coils fabricated with epoxy impregnation has been observed. The difference in thermal expansion coefficients of the tape and epoxy may result in the transverse stress on the tape. Thus, if the tolerance of the tape to this stress is low, then coil degradation may occur. Further, as a significant proportion of the applications of present-day 2G HTS tape involve coil geometries, this mechanical weakness poses a significant problem in the deployment of 2G HTS tapes to these industries.

Thus, there is a demand for a HTS tape having improved transverse tensile strength and electrical properties for commercial applications.

BRIEF SUMMARY

Disclosed herein is a novel 2G HTS tape architecture having a plurality of superconducting filaments and constructed in a plurality of configurations. More specifically, in one exemplary configuration, the HTS tape includes the superconducting filament sandwiched or captured between a substrate and the overlayer, for example a silver overlayer. Additionally, a compliant material, comprising the overlayer, may be disposed between each of the superconducting filaments.

In one configuration, there is a superconductor structure comprising a substrate, a compliant material layer, a superconducting layer, an overlayer, wherein the superconducting layer comprises a plurality of gaps having a width of less than about 100 µm, and wherein the compliant material layer is present in the gaps described herein. The superconductor structure comprises gaps that are generally aligned or otherwise consider substantially parallel along the length of the tape. Further, in some instances, the resistivity of the compliant material is higher than 1 mΩcm, wherein the compliant material comprises a material chosen from a group consisting of metals, alloys, metal-ceramic composites, and combinations thereof. In some exemplary configurations, the compliant material comprises silver.

In another exemplary configuration, a HTS tape structure comprises a substrate, a compliant material layer, a superconducting layer, having at least one gap therein, and an overlayer. In instances, the compliant material is present in the gap of the superconducting layer, wherein the compliant material comprises one material chosen from a group consisting of metals, alloys, metal-ceramic composites, and combinations thereof In certain instances, the compliant material comprises a high ductility. In certain instances, the compliant material comprises silver and further, a resistivity that is at least about 1 mΩcm.

Also disclosed herein is an exemplary superconducting tape comprising: a plurality of superconducting filaments supported on a substrate, a compliant material layer, and an overlayer. In some configurations, the compliant material is disposed between the superconducting filaments and extends between the substrate and the overlayer. The superconducting tape includes gaps for retaining the compliant material between adjacent superconducting filaments, wherein the gaps comprise a distance that is less than 100 µm, are substantially parallel along the length of the tape, and have a resistivity that is higher than 1 mΩcm. Without limitation, the compliant material comprises a material chosen from a group consisting of metals, alloys, metal-ceramic composites, and combinations thereof, and certain configurations the compliant material comprises silver.

The configurations described herein comprise a combination of characteristics and features intended to address various shortcomings associated with certain prior compositions, combinations, structures and devices. The various characteristics and features described above, as well as others, will be readily apparent to those skilled in the art upon reading the following detailed description and by referring to the accompanying drawings.

BRIEF DESCRIPTION OF THE DRAWINGS

For a detailed description of the exemplary configurations of the disclosure, reference will now be made to the accompanying drawings in which.

DETAILED DESCRIPTION

Figure 1:
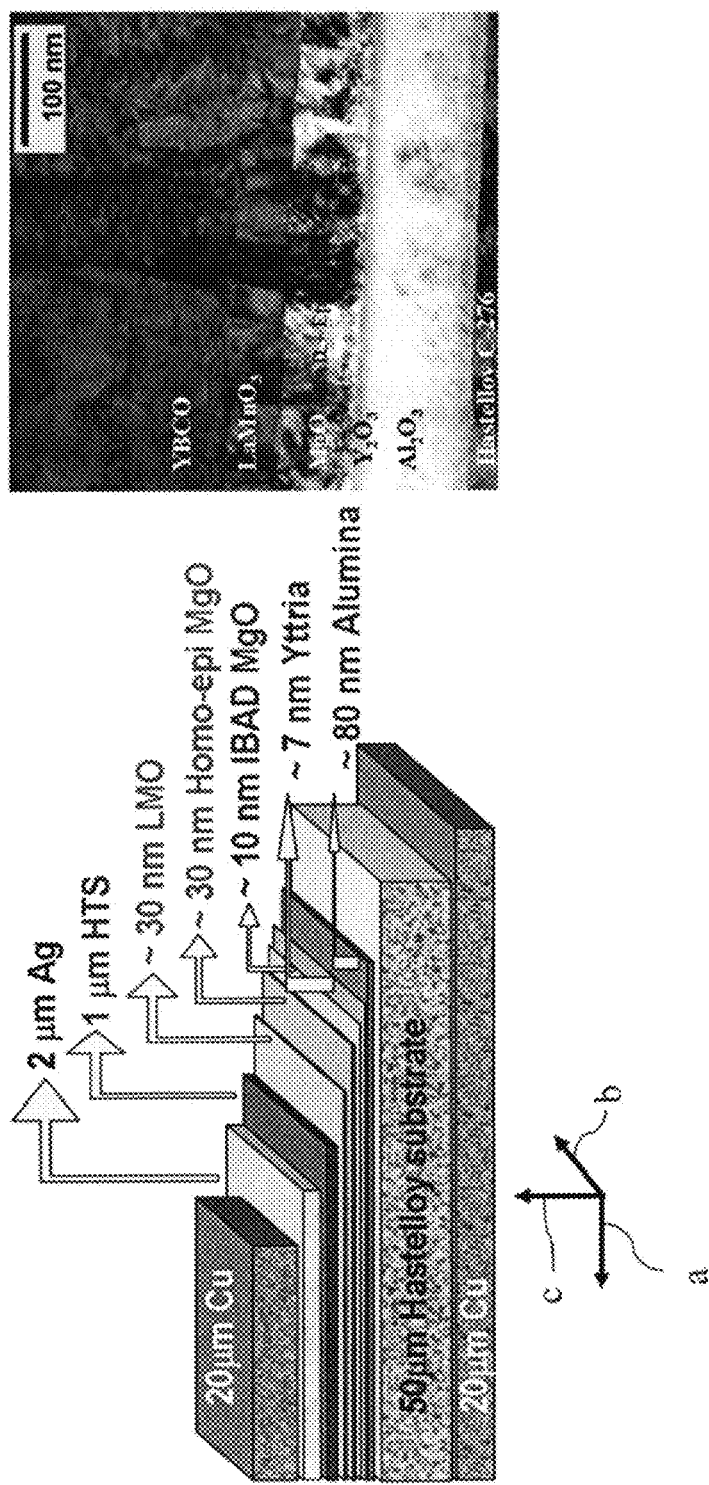
FIG. 1 illustrates a schematic cross-sectional microstructure of conventional thin film superconducting tape adjacent to a photomicrograph thereof.

As shown in FIG. 1, there are typically about nine components in a conventional 2G HTS tape. The architecture consists of several oxide films on a metallic substrate and capped with silver and copper overlayers. As summarized hereinabove, the composite structure is prone to debonding between individual layers and delamination within the superconductor layer. 2G HTS tapes demonstrate these potential weaknesses when a tensile stress is applied normal to the tape's surface as, for example, when a uniform pull is imparted on the tape by means of Lorentz force acting mutually perpendicular to a transport current flowing through a superconducting tape and an externally applied magnetic field. More specifically, the transport current is flowing through the superconducting tape in a longitudinal direction, for example along the a-axis. The magnetic force in these configurations would be applied along the b-axis. In this test configuration, the Lorentz force acts along the c-axis. Hence, a significant force is applied normal to the tape's surface in this configuration. During these tests, the fracture surfaces of the 2G HTS tape reveal the interfaces and films that may exhibit high frequencies of debonding and delamination.

Figure 2:
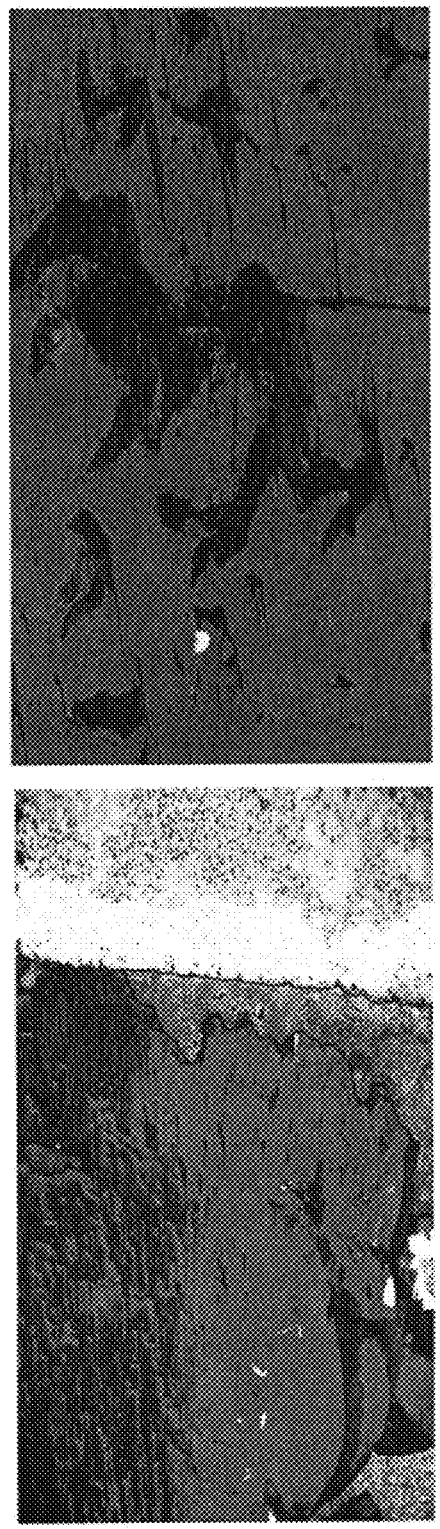
FIG. 2 illustrates the fracture surfaces of a plurality of conventional superconducting tapes after debonding and delamination during testing at high transport current and high magnetic field, the gray regions being the top buffer layer and the darker regions being the exposed superconducting layer.

Referring now to FIG. 2, the photomicrograph illustrates examples of the fracture surfaces resultant from debonding and delamination in certain conventional 2G HTS tapes. FIG. 2 specifically illustrates that the interface between the $LaMnO_3$ (LMO) top buffer layer and the $REBa_2Cu_3O_x$ (REBCO) superconducting film is prone to debonding under these transverse stresses. Meanwhile, the REBCO itself is prone to delamination within as shown in the FIG. 2. Additionally, it is known that coils fabricated with epoxy impregnation are poorly resistant to transverse stresses. Specifically, the thermal expansion coefficient differences between the tape and the epoxy may result in sufficient transverse stress on the tape causing it to debond or delaminate it. Further, if the tolerance of the tape to this degradation is low, then coil degradation occurs. Generally, the expected 2G HTS tape applications involve coil geometries, and thus this mechanical weakness poses a significant barrier to the implementation and deployment of 2G HTS tapes commercially.

Generally, the disclosed configurations relate to redirecting tensile stress transverse to the longitudinal axis, or a-axis, of the tape between a substrate and an overlayer. In one configuration, there is disclosed a high temperature superconductor having multiple filaments supported on a substrate and having an over layer. Further, the overlayer may be a compliant or flexible layer that comprises silver or materials with similar characteristics, such as but not limited to metals, alloys, ceramics, and composites or combinations thereof In instances, the compliant layer may comprise a highly ductile material. The overlayer may extend between the multiple filaments of the superconductor in order to contact, join, or bond to the substrate. The overlayer and substrate connected by this configuration are intended to reduce, prevent, or redirect delamination, debonding, cracking, and other deleterious responses to stress applied to the filaments.

Figure 3:
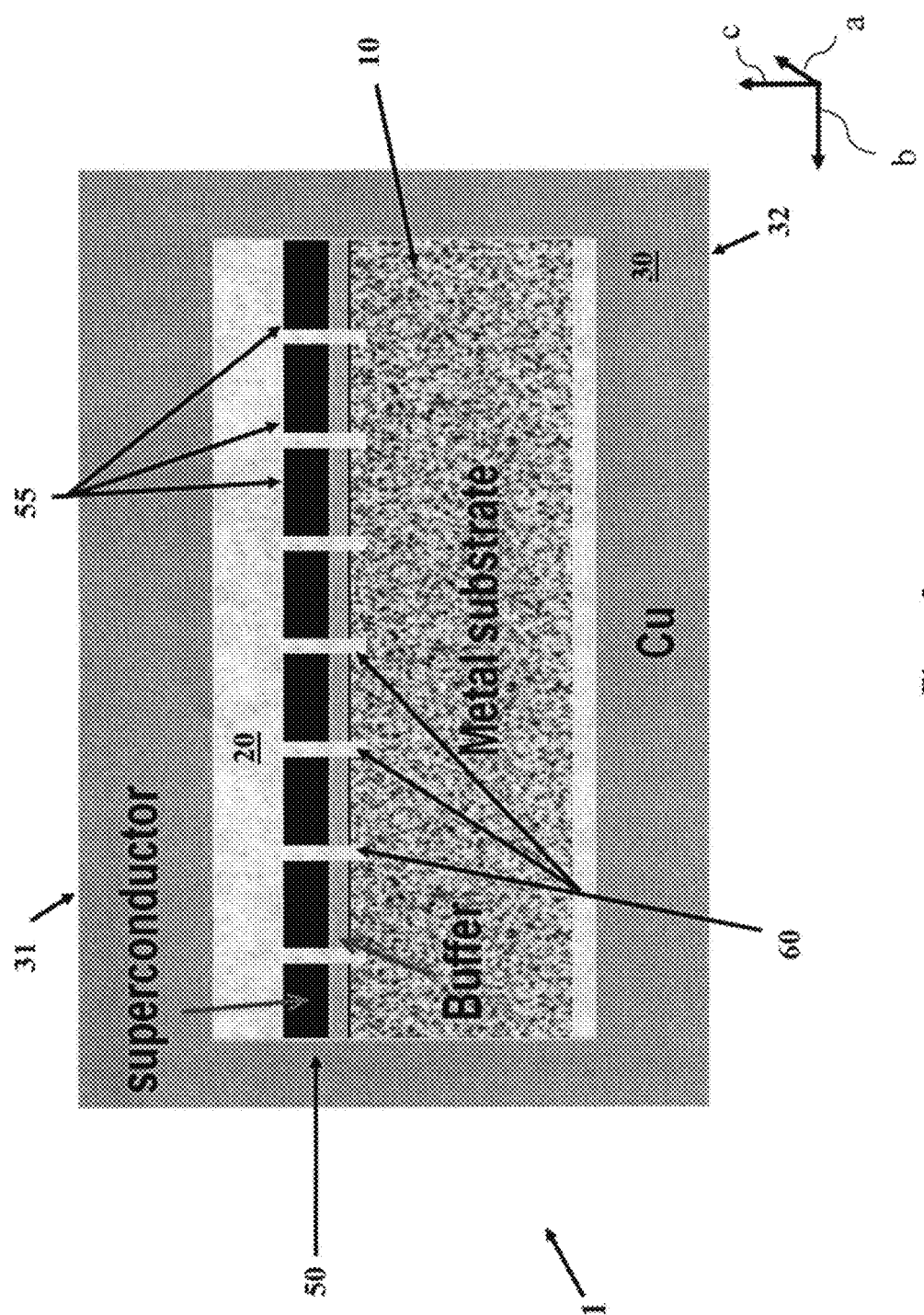
FIG. 3 illustrates schematic cross-section of 2G HTS tape architecture made in accordance with principles disclosed herein and having multifilmentary superconductor and buffer films separated by a compliant layer that contacts the silver layer on the top and metal substrate on the bottom.

Referring to FIG. 3, there is illustrated a cross-sectional schematic according to one configuration of the present disclosure. Generally, a substrate 10, comprising metal or alloys, supports a superconducting layer 50. The superconducting layer 50 comprises a plurality of materials or material layers including the superconductor film and buffer film as illustrated in FIG. 1. Generally, these material layers are deposited on the metal substrate 10 sequentially to form, collectively, the "superconducting layer" 50 as defined herein. The superconducting layer 50 has approximately the same dimensions, for example in the a-b plane of FIG. 1, as the substrate. An overlayer 20 covers the superconducting layer 50 and the substrate 10 and an outer stabilizer coating 30, for example comprising copper, is applied or coated around the substrate 10 and overlayer 20. In certain applications the outer stabilizer coating 30 completely envelopes and surrounds the substrate 10 and overlayer 20 containing the superconducting layer 50. Generally, the outer stabilize coating 30 has a top surface 31 and a bottom surface 32, that are parallel to the a-b plane as illustrated in FIG. 1.

In an exemplary configuration of a superconducting article 1 shown FIG. 3, the superconducting layer 50 is divided to form superconducting filaments 55. The division, or conversion to superconducting filaments 55 may comprise a "top-down" or deleterious method that removes portions of the superconducting layer 50 to the substrate 10. The removed material of the superconducting layer 50 forms gaps 60. As used herein, the term "gap" refers to a void where superconducting material is not present. Alternatively, the fabrication of the superconducting filaments 55 may comprise a "bottom-up" or additive method that adds the superconducting filaments onto the substrate 10, with gaps 60 being maintained between the filaments 55. There may be a plurality of gaps 60 across the a-b plane of the superconducting article 1. The overlayer 20 may be deposited over superconducting filaments 55 such that overlayer 20 covers the filaments 55 and also fills gaps 60. Gaps 60 are generally less than about 100 μm in width. In certain configurations, the gaps have a width of less than about 50 μm in width. Further, in some configurations the gaps are less than about 20 μm or alternatively, less than about 5 μm.

Figure 4:
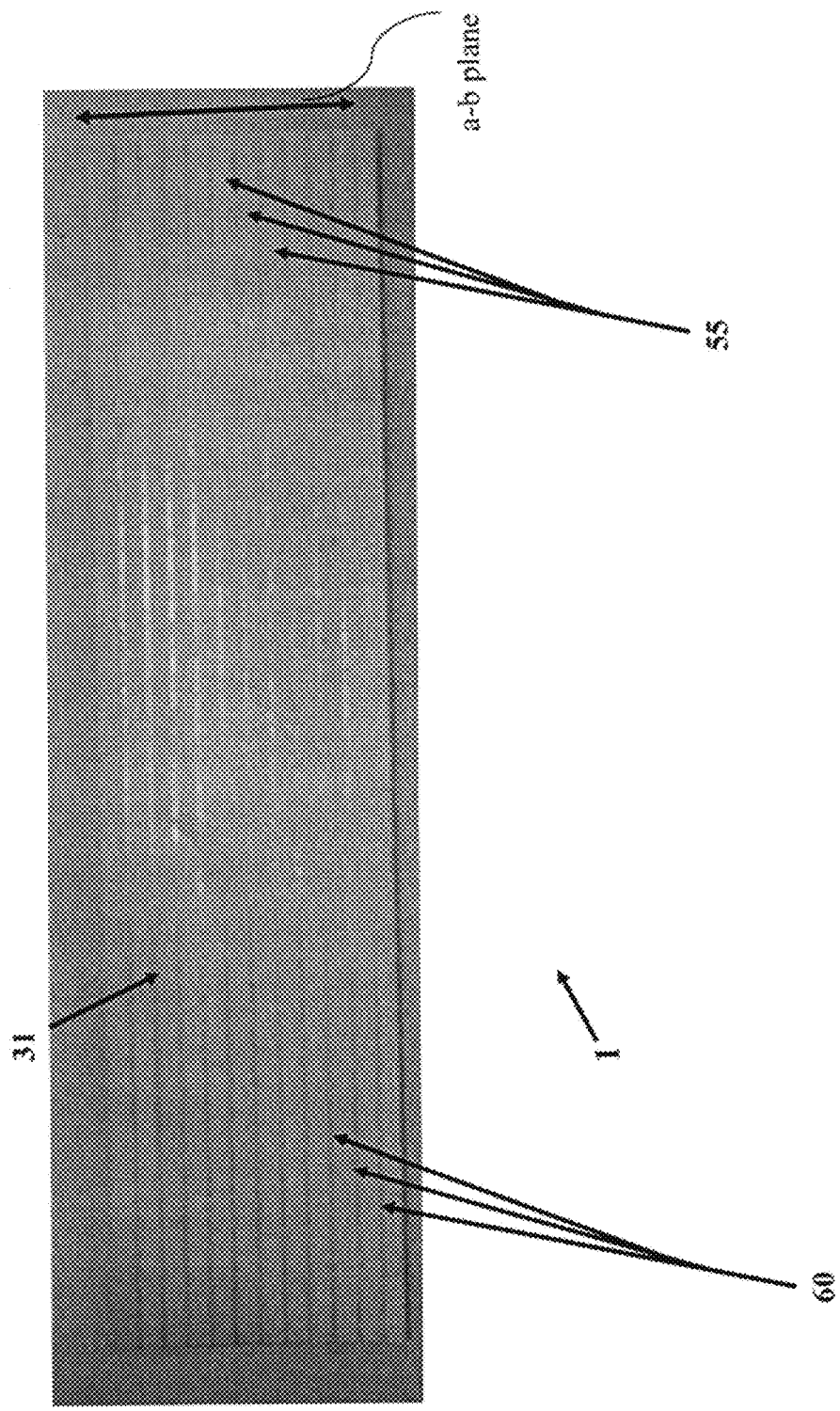
FIG. 4 shows a photographic top view of a multifilament 2G HTS tape made in accordance with principles disclosed herein and having silver between individual filaments of superconductor and buffer films

FIG. 4 shows a photograph of a superconducting article 1 comprising 2G HTS tape architecture having multiple filaments 55 separated by gaps 60. The superconducting article 1 shown has exemplary configuration comprising silver disposed between the superconducting filaments 55. In this exemplary configuration, the gaps 60 were created in this superconductor 50, which includes the superconductor film and buffer film, by mechanical scribing followed by deposition of a silver layer in the gaps 60 resulting in a direct contact between the silver above the superconductor film, in the overlayer, and the substrate below the superconductor film.

Referring again to FIG. 3, the gaps 60 are formed along the length of the superconducting article 1 in the superconducting layer 50. The gaps 60 may be formed by mechanical removal of a portion of the superconducting layer 50. The gaps 60 may be mechanically formed by longitudinally scribing a blade along the superconducting layer 50 after deposition. Alternatively, the gaps may be formed by scribing after deposition of the overlayer wherein the overlayer and superconductor layer are both removed during scribing. A subsequent overlayer may be deposited thereon. Additional mechanical means of forming gaps 60 include utilizing a scribe, a probe, or a scanning tip, without limitation. The mechanical means of forming gaps 60 may include additional material to maintain resolution (i.e. shape, depth) of the gaps 60 by maintaining sharpness of the cutting surface, for example diamond edges.

Alternatively, the gaps 60 may be formed by photo-ablation, such that electro-magnetic radiation removes material from the superconducting layer 50. Generally, photo-ablation comprises electro-magnetic radiation around the visible spectrum, such that infra-red (IR) or ultra-violet (UV) irradiation may be used. The photo-ablation may comprise optically amplified electro-magnetic radiation, such as a laser. The photo-ablation may be configured for sublimation (i.e. vaporization) of the superconducting layer 50 to form gaps 60 along a predetermined path. Photo-ablation may cause a phase change, chemically alter, or mechanically (i.e. knock out, sputter) remove material from the superconducting layer 50. Photo-ablation may employ additional techniques or components such as, but not limited to, masks, filters, lenses, other radiation-manipulating devices, and combinations thereof to control the spatial coherence, intensity, temperature, and other characteristics of the electromagnetic radiation without limitation. In certain applications, the photo-ablation may be photolithography and associated techniques, without limitations.

Still further, the gaps 60 may be formed by etching. Without limitation by any particular theory, as used herein etching may refer to any chemical reaction or chemical process to form gaps 60 in the superconducting layer 50. Etching may be done as a wet-etch (liquid phase etching) or as a dry-etch (plasma-phase etching). Generally, the etching process may use any known etchant or chemical. Further, the etchant may be selected for anisotropic etching, such that the direction of the etching is dependent on the crystalline structure of the superconducting layer 50. In instances, anisotropic etching may be used to minimize undercutting or side-cutting of the gaps 60. As used herein, undercutting or side-cutting refer to damage to the superconducting filaments 55 at the edge of the gaps 60 caused by a chemical reaction continuing in the superconducting layer 50 in the a-b plane.

Still further, the gaps 60 may be formed by differential deposition. In certain instances, differential deposition may comprise a 'bottom-up' synthesis of the superconducting article 1. In non-limiting exemplary bottom-up method, there is first deposited each of the filaments 55 of the superconducting layer 50. The subsequent overlayer deposition 20 achieves the superconducting architecture described hereinabove and shown in FIG. 3.

Generally, a superconducting article assembled thusly, redirects transverse stresses transverse to the longitudinal axis (a-axis) of the tape between the substrate and overlayer. More specifically, the deposition of the material of the overlayer into the gaps provides for compliant material to be disposed between the superconducting filaments. The compliant material withstands the force applied along the c-axis. Additionally, certain layers disposed between the superconducting layer 50 and the substrate may act as buffers. The buffer layers may comprise material having similar compliant behavior and properties as the overlayer and in the gaps. Generally, this configuration ties or bonds the substrate and the overlayer, thereby encapsulating the superconducting filaments. Additionally, as the superconductor and buffer films are converted into individual filaments running parallel to the tape length, and the gap between them is filled with a compliant material from the overlayer, transverse stresses are less likely to lead to debonding, delamination, crack propagation or similar damage.

As may be understood from the disclosure herein, the presence of a conducting layer or conducting contact between the superconducting filaments results in coupling of the filaments. Coupled multi-filamentary tapes exhibit high AC losses and reduce the potential applications for 2G HTS tapes. Multi-filamentary 2G HTS tapes configured according to the disclosure herein, having aligned, generally parallel superconducting filaments separated by a compliant material, have applications for lowering alternating current (AC) losses, particularly if there is an insulating compliant layer or a high resistive compliant layer disposed in the gap between the individual superconductor filaments. In further instances, a compliant layer with a resistivity of higher than about 1 mΩcm may be preferred.

Exemplary embodiments are disclosed herein and variations, combinations, and/or modifications of such embodiment(s) may be made by a person having ordinary skill in the art and are within the scope of the disclosure. Alternative embodiments that result from combining, integrating, and/or omitting features of the expressly-disclosed embodiment(s) are also within the scope of the disclosure. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" means "including but not limited to" and should be understood to also provide support for narrower terms such as "consisting of", "consisting essentially of", and "comprised substantially of" Accordingly, the scope of protection is not limited by the description set out above but is defined by the claims that follow, that scope including all equivalents of the subject matter of the claims. Each and every claim set out below is incorporated into this specification as additional disclosure, and each is an exemplary embodiment of the present invention. All patents, patent applications, and publications cited in this disclosure are hereby incorporated by reference, to the extent that they provide exemplary, procedural or other details supplementary to the disclosure.

I claim:

1. A method for assembling a HTS tape structure, the method comprising:
providing a substrate;
depositing a superconducting layer on the substrate, the superconducting layer having at least one gap therein, wherein the substrate has a top surface adjacent the superconducting layer that has a gap therein that coincides with and extends to each gap within the superconducting layer; and
depositing an overlayer on the superconducting layer and the substrate within the at least one gap of the superconducting layer and within each gap within the substrate top surface, wherein the overlayer comprises compliant material.

2. The method of claim 1, wherein the compliant material comprises a material chosen from a group consisting of metals, alloys, metal-ceramic composites, and combinations thereof.

3. The method of claim 1, wherein the compliant material comprises silver.

4. The method of claim 1, wherein the compliant material comprises a resistivity that is at least about 1 mΩcm.

5. The method of claim 1, wherein each gap within the superconducting layer is generally aligned along the length of the tape.

6. The method of claim 1, wherein the superconducting layer comprises a buffer layer, and wherein the buffer layer has each gap within the superconducting layer therein.

7. The method of claim 1, wherein each gap within the superconducting layer has a width of less than 100 µm.

8. The method of claim 1, wherein each gap within the superconducting layer has a width of less than about 50 µm.

9. The method of claim 1, wherein each gap within the superconducting layer has a width of less than about 20 µm.

10. The method of claim 1, wherein each gap within the superconducting layer has a width of less than about 5 µm.

11. The method of claim 1, wherein each gap within the superconducting layer is formed by scribing the superconducting layer.

12. The method of claim 1, wherein the step of depositing the superconducting layer on the substrate comprises depositing the superconducting layer on the substrate in spaced-apart strips, therebeing a gap between adjacent strips, thereby providing the at least one gap of the superconducting layer.

13. A method for assembling a superconductor structure, the method comprising:
depositing a plurality of superconducting filaments on a substrate, the superconducting filaments having a gap between each filament, wherein the substrate has a top surface adjacent the superconducting filaments that has a gap therein that coincides with and extends to each gap between each filament; and
depositing an overlayer atop the filaments and into each gap between each filament and each gap within the substrate top surface and contacting the substrate;
wherein the overlayer comprises compliant material.

14. The method of claim 13, wherein the compliant material comprises a material chosen from a group consisting of metals, alloys, metal-ceramic composites, and combinations thereof.

15. The method of claim 13, wherein the compliant material comprises silver.

16. The method of claim 13, wherein the resistivity of the compliant material is higher than 1 mΩcm.

17. The method of claim 13, wherein each gap between each filament is substantially parallel to each other along the length of the tape.

18. The method of claim 13, wherein each filament comprises a buffer layer.

19. The method of claim 13, wherein each gap between each filament has a width of less than 100 µm.

20. The method of claim 13, wherein each gap between each filament has a width of less than about 50 µm.

21. The method of claim 13, wherein each gap between each filament has a width of less than about 20 µm.

22. The method of claim 13, wherein each gap between each filament has a width of less than about 5 µm.

* * * * *